United States Patent
Chen et al.

(10) Patent No.: US 8,362,794 B2
(45) Date of Patent: Jan. 29, 2013

(54) METHOD AND SYSTEM FOR ASSESSING RELIABILITY OF INTEGRATED CIRCUIT

(75) Inventors: Fen Chen, Essex Junction, VT (US); Kai D Feng, Hopewell Junction, NY (US); Zhong-Xiang He, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 598 days.

(21) Appl. No.: 12/508,111

(22) Filed: Jul. 23, 2009

(65) Prior Publication Data
US 2011/0018575 A1 Jan. 27, 2011

(51) Int. Cl.
*G01R 31/02* (2006.01)
(52) U.S. Cl. ............ 324/762.01; 324/762.09
(58) Field of Classification Search . 324/762.01–762.09
See application file for complete search history.

(56) References Cited

U.S. PATENT DOCUMENTS

| | | | |
|---|---|---|---|
| 3,979,672 A * | 9/1976 | Arnoldi ............ 324/762.08 |
| 5,600,578 A | 2/1997 | Fang et al. |
| 5,615,377 A * | 3/1997 | Shimizu et al. ............ 703/13 |
| 5,625,288 A | 4/1997 | Snyder et al. |
| 6,214,630 B1 * | 4/2001 | Hsuan et al. .............. 438/11 |
| 6,275,059 B1 * | 8/2001 | Sah et al. ............ 324/762.05 |
| 6,587,994 B1 | 7/2003 | Yamaji |
| 6,661,249 B2 * | 12/2003 | Oyrer .................. 324/762.09 |
| 6,684,353 B1 | 1/2004 | Parker et al. |
| 6,724,214 B2 | 4/2004 | Manna et al. |
| 6,815,970 B2 * | 11/2004 | Rost et al. ............ 324/762.02 |
| 6,872,032 B2 * | 3/2005 | Boys ...................... 405/284 |
| 6,873,171 B2 * | 3/2005 | Reynick .............. 324/762.01 |
| 7,106,087 B2 * | 9/2006 | Okada ............... 324/754.03 |
| 7,106,088 B2 * | 9/2006 | Tsai et al. ............ 324/762.09 |
| 7,268,575 B1 * | 9/2007 | Chen et al. ........... 324/762.09 |
| 7,274,247 B2 * | 9/2007 | Ward et al. .............. 327/534 |
| 7,292,968 B2 * | 11/2007 | Wu et al. ................. 703/13 |
| 7,330,046 B2 * | 2/2008 | Durbaum ............ 324/750.01 |
| 7,332,924 B2 | 2/2008 | Harris et al. |
| 7,400,162 B2 * | 7/2008 | Gattiker et al. ....... 324/762.01 |
| 7,538,538 B2 * | 5/2009 | Dodabalapur et al. ...... 324/71.5 |
| 7,545,161 B2 | 6/2009 | Hsu et al. |
| 7,567,891 B1 * | 7/2009 | Liu et al. ................. 703/13 |
| 7,919,976 B2 * | 4/2011 | Ball ................... 324/762.08 |
| 8,094,033 B2 * | 1/2012 | Dauphinee et al. ......... 340/653 |
| 2005/0144524 A1 | 6/2005 | Bonaccio et al. |
| 2007/0168759 A1 | 7/2007 | Goodnow et al. |

OTHER PUBLICATIONS

Hess, Haggag, McMahon, Cheng, Lee, Lyding, "A Statistical Model for Intrinsic Failures in Nanometer Chip Technology and Use of Short-Time Tests for Reliability", The Physics of Determing Chip Reliability, Circuits and Devices, May 2001, pp. 33-38.

(Continued)

*Primary Examiner* — Joshua Benitez Rosario
(74) *Attorney, Agent, or Firm* — Yuanmin Cai (57) ABSTRACT

The present invention provides a method. The method includes operating a plurality of field-effect-transistors (FETs) under a first operation condition; reversing an operation direction for at least one of the plurality of FETs for a brief period of time; measuring a second operation condition of the one of the plurality of FETs during the brief period of time; computing a difference between the second operation condition and a reference operation condition; and providing a reliability indicator based upon the difference between the second and the reference operation conditions, wherein the plurality of FETs are employed in a single integrated circuit (IC).

22 Claims, 7 Drawing Sheets

OTHER PUBLICATIONS

Kim, Persaud, Kim, "Silicon Odeometer: An On-Chip Reliability Monitor for Measuring Frequency Degradation of Digital Circuits", IEEE Journal of Solid-State Circuits, vol. 43, Nov. 4, Apr. 2008, pp. 874-880.

Mishra, Pecht, Goodman, "In-situ Sensors for Product Reliablity Monitoring", CALCE Electronic Products and Systems Center; Ridgetop Group, Inc.

Li, Rosenbaum, Tao, Fang, "Projecting Lifetime of Deep Submicron MOSFETs", IEEE Transactions on Electron Devices, vol. 48, No. 4, Apr. 2001, pp. 671-678.

Pagey, "Characterization and Modeling of Hot-Carrier Degradation in Sub-Micron NMOSFETS", Thesis Submitted to the Faculty of the Graduate School of Vanderbilt University in partial fulfillment of the requirements for the degree of Master of Science in Electrical Engineering, Aug. 2002, Nashville, TN, pp. 1-60.

Information Materials for IDS dated Aug. 13, 2012, Prepared by Xiao Qi Zhi. SIPO Office Action dated Aug. 3, 2012, Application No. 201010229672.1, Filed Jul. 13, 2010.

* cited by examiner

METHOD AND SYSTEM FOR ASSESSING RELIABILITY OF INTEGRATED CIRCUIT

FIELD OF THE INVENTION

The present invention relates generally to the field of integrated circuit and, in particular, relates to method and circuit system for assessing reliability of integrated circuit having large number of field-effect-transistors.

BACKGROUND OF THE INVENTION

As development of high performance, high speed integrated circuit (IC) continues, the number of semiconductor devices, and particularly active semiconductor devices such as transistors like, for example, silicon-germanium (SiGe) heterojunction bipolar transistors (HBTs) and various field-effect-transistors (FETs), being used inside a single IC continues to grow in an explosive manner. As a result, maintaining an IC chip that utilizes large number of semiconductor devices highly reliable is rapidly becoming one of the most challenging tasks during current technology development. For an IC chip involving a million or even a billion of FETs, one single failure of the FETs could, at least in theory, cause the entire chip or a system that utilizes the failed FET to fail or malfunction. On the other hand, with the continued scaling toward developing very-large-scale-integrated (VLSI) circuits, reliability margins for each individual transistors or FETs are shrinking dramatically, which further exacerbates the above reliability concern at the IC chip level.

SUMMARY OF EMBODIMENTS OF THE INVENTION

There is a need in the art to create semiconductor circuits or improve existing semiconductor circuits that can be used reliably for some critical applications such as military, medical, and space applications. For the current state-of-art ICs, transistor hot carrier induced threshold voltage (Vt) and on-switch current (Ion) shift are some of the most important chip reliability issues that need to be addressed during chip operation. Embodiments of the present invention provide a solution for mitigating above reliability concerns. The solution provides an "on-chip" built-in reliability monitor, which provides real time reliability prognostics to monitor the state of devices during their operational lifetime and generates, if necessary, an early warning signal for a potential device failure.

Embodiments of the present invention provide a method, and an on-chip reliability monitoring system employing the method, that may provide an early warning signal before a functional transistor fails. In other words, the reliability monitoring system according to present invention may overcome certain statistical barrier to assure that, in one embodiment, no single active device among many others possibly in the billions, devices on chip may fail earlier than the monitoring device itself.

Embodiments of the present invention provide a method which includes: operating a plurality of field-effect-transistors (FETs) under a first operation condition; reversing an operation direction for at least one of the plurality of FETs for a brief period of time; measuring a second operation condition of the one of the plurality of FETs during the brief period of time; computing a difference between the second operation condition and a reference operation condition; and providing a reliability indicator based upon the difference between the second and the reference operation conditions, wherein the plurality of FETs are employed in a single integrated circuit (IC). In one embodiment, the first operation condition is a forward saturated operation condition having a first operation current and a first operation voltage; the second operation condition is a reverse saturated operation condition having a second operation current and a second operation voltage; and the reference operation condition, having a reference operation current and a reference operation voltage, is the forward saturated operation condition at a time when the plurality of FETs starts regular usage.

In one aspect, computing the difference includes calculating a difference between the second operation current and the reference operation current, with the second operation voltage being substantially same as the reference operation voltage. In another aspect, providing the reliability indicator includes comparing the difference between the second and the reference operation currents with a predetermined threshold, and providing a warning signal being scaled based upon how far the difference is away from the predetermined threshold.

Embodiments of the present invention further includes recording the reference operation current of the one of the plurality of FETs at the time when the plurality of FETs starts regular usage; and setting the predetermined threshold as a percentage of the reference operation current. In one aspect, the predetermined threshold is set at approximately 10% of the reference operation current.

According to one embodiment of the present invention, the one of the plurality of FETs is a reliability sensor and the brief period of time, when the reliability sensor is operated under the second operation condition, is substantially shorter than a regular period of time when the plurality of FETs are operated under the first operation condition, thereby the brief period of time will not create any detectable difference in reliability between the reliability sensor and the plurality of FETs excluding the reliability sensor. For example, the brief period of time may be less than 0.1% or even 0.01% of the regular period of time.

Embodiments of the present invention further includes computing a difference between the first operation current of the reliability sensor and the reference operation current, while the first operation voltage being substantially the same as the reference operation voltage; and providing a recommendation to replace a pre-selected set of FETs of the plurality of FETs if the difference exceeds a pre-set value. In one aspect, the pre-set value is about 10% of the reference operation current. The method then replaces the pre-selected set of FETs with a set of built-in backup FETs automatically or upon receiving an external instruction following the recommendation.

In one embodiment of the invention, the plurality of FETs has substantially same dimensions and substantially similar structures, thereby experiences a substantially same reliability degradation process over time. In another embodiment of the invention, the plurality of FETs is manufactured in close vicinity to each other of the single IC to experience a substantially same environmental effect.

BRIEF DESCRIPTION OF THE DRAWINGS

The present invention will be understood and appreciated more fully from the following detailed description of the invention, taken in conjunction with the accompanying drawings of which.

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF THE INVENTION

In the following detailed description, numerous specific details are set forth in order to provide a thorough understanding of embodiments of the invention. However, it will be understood by those of ordinary skill in the art that embodiments of the invention may be practiced without these specific details. In the interest of not obscuring presentation of essences and/or embodiments of the present invention, in the following detailed description, processing steps and/or operations that are well known in the art may have been combined together for presentation and/or for illustration purpose and in some instances may not have been described in detail. In other instances, processing steps and/or operations that are well known in the art may not be described at all. A person skilled in the art will appreciate that the following descriptions have rather focused on distinctive features and/or elements of embodiments of the present invention.

In the following detailed description, well-known device processing techniques and/or steps may not be described in detail and, in some instances, may be referred to other published articles or patent applications in order not to obscure the description of the essence of presented invention as further detailed herein below.

Figure 1:
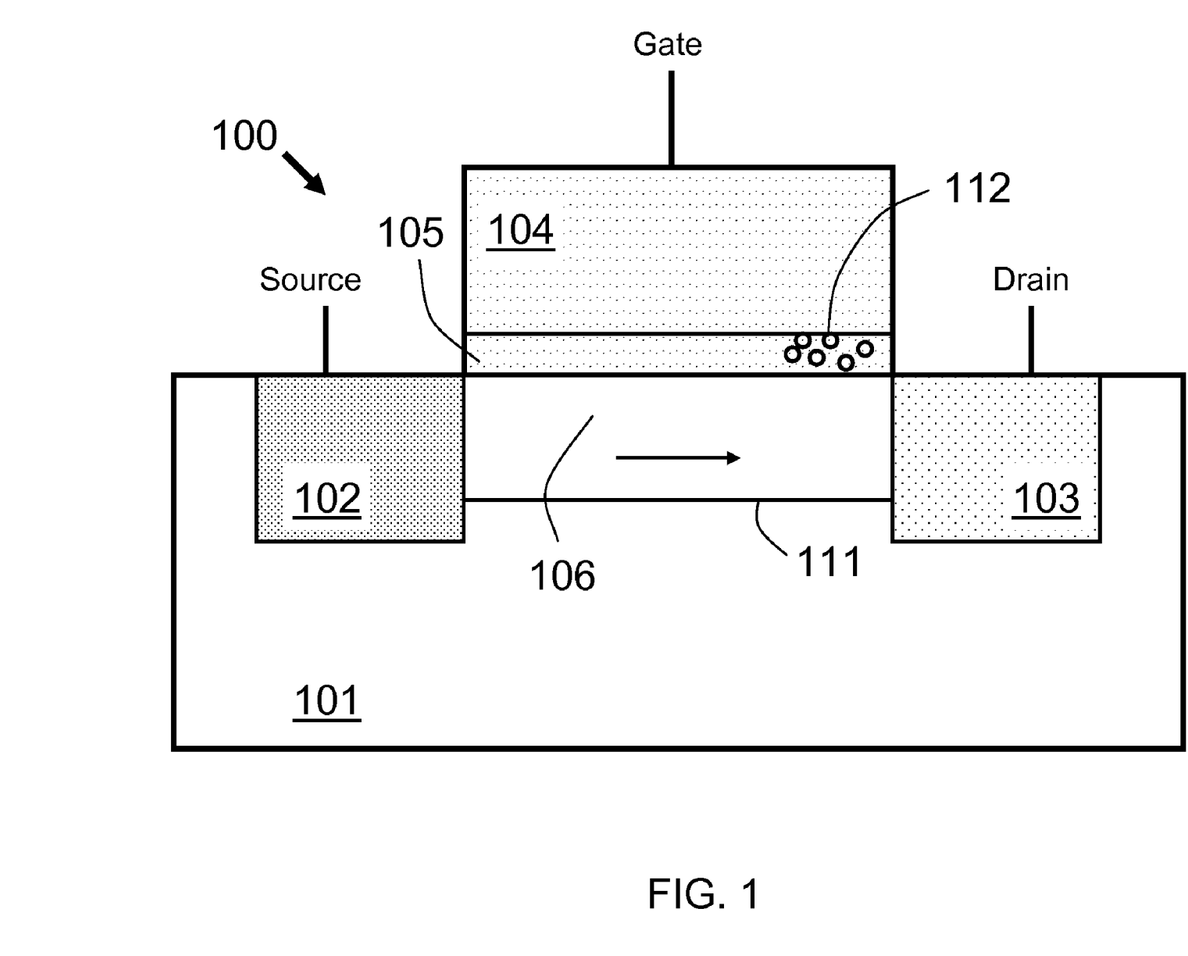
FIG. 1 is a simplified demonstrative illustration of a field-effect-transistor (FET) and operation of the FET during a linear operation condition.

FIG. 1 is a simplified demonstrative illustration of a field-effect-transistor (FET) under a linear operation condition. FET 100 may be, for example, a complementary metal-oxide-semiconductor FET (CMOS-FET), and may be formed on top of a semiconductor substrate 101. FET 100 may include source/drain regions 102 and 103, a gate conductor 104, and a gate dielectric layer 105 underneath gate conductor 104. Both gate conductor 104 and gate dielectric layer 105 are formed on top of a channel region 106 of FET 100. Generally, a FET may also include other elements and/or components such as, for example, spacers, source/drain extension regions, halo implants, silicide contacts, etc. However in the following description of the present invention, these elements and/or components are not essential and thus their details may be omitted and may not be illustrated in FIG. 1, as well as in FIG. 2 and FIG. 3, with regard to description of FET 100 in order not to obscure description and illustration of essences of the present invention. Additionally, FET 100 may be a FET doped with p-type dopant (PFET) or a FET doped with n-type dopant (NFET). For the sake of description without losing generality, FET 100 is described below as an NFET and more specifically as a CMOS-NFET device.

During operation, majority carriers in channel region 106 of NFET 100 may be electrons. For example, as being illustrated in FIG. 1, during a regular linear operation mode, source/drain region 102 may be used as a source and may be grounded, and source/drain region 103 may be used as a drain and may be applied a voltage. A voltage may be applied to gate 104 as well. In one aspect of the invention, for example, a gate-to-source voltage $V_{GS}$ may be applied to gate 104 which may be larger than a threshold voltage $V_{th}$ and a drain-to-source voltage $V_{DS}$ may be applied to drain 103 which may be smaller than $(V_{GS}-V_{th})$. Under the above operation condition, electrons may flow from source 102 to drain 103 along channel region 106, as being illustrated by the arrow in FIG. 1. In the channel region 106, there may be formed a generally uniform electron density 111. At the vicinity close to drain 103, there may be a small amount of energetic electrons 112 being trapped along an interface between gate dielectric layer 105 underneath gate conductor 104 and channel region 106, as being described below in more details.

According to an embodiment of the invention, FET 100 may be used as a reliability sensor for determining and/or predicting reliabilities of other field-effect-transistors, which may be manufactured in close vicinity relative to FET 100 on a same semiconductor chip to provide certain functionalities of the chip. In the following description, FETs that provide functionalities of a semiconductor chip may be referred to as "functional FETs" and FET 100 may be referred to as reliability sensor 100 to be distinguished from other functional FETs whose reliabilities are being monitored by reliability sensor 100. In one embodiment, functional FETs may be manufactured to have substantially same dimensions and substantially similar structures and may be operated under a substantially same operation condition as reliability sensor 100 such that the reliability of reliability sensor 100 may closely represent those of functional FETs. In other words, reliability sensor 100 may experience a substantially same reliability degradation process over time, or aging effect, as those of functional FETs.

Figure 2:
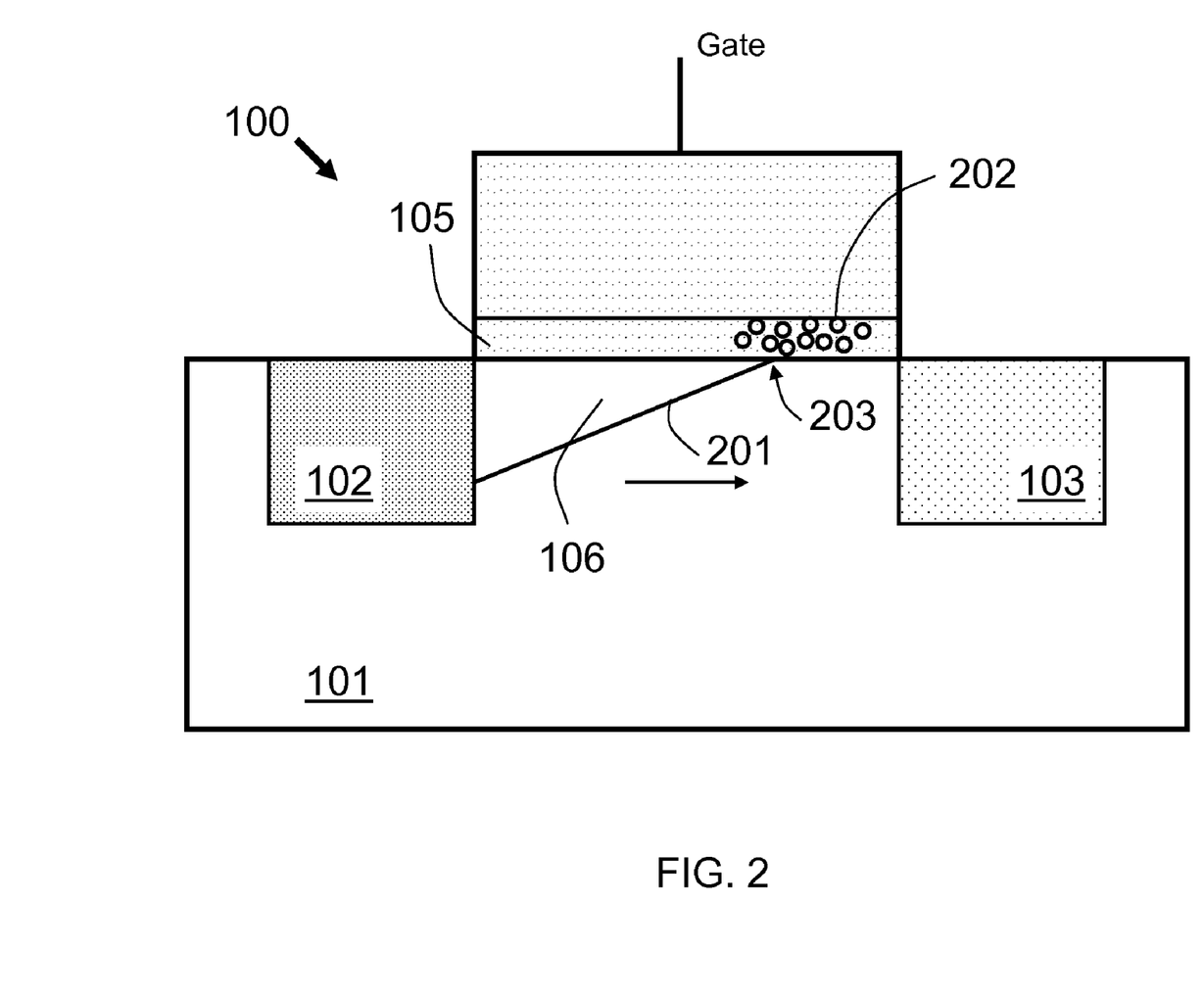
FIG. 2 is a demonstrative illustration of a reliability sensor being operated under a forward saturation operation condition according to an embodiment of the invention.

FIG. 2 is a demonstrative illustration of a reliability sensor being operated under a forward saturated operation condition according to an embodiment of the invention. For example, reliability sensor 100 may be forward biased at saturation, or under forward saturated operation condition, such that the drain-to-source voltage $V_{DS}$ is larger than $(V_{GS}-V_{th})$, as compared with being smaller than $(V_{GS}-V_{th})$ under a linear operation condition. On the other hand, the gate-to-source voltage $V_{GS}$ is larger than threshold voltage $V_{th}$ similar to the linear operation condition. As is known in the art, forward saturated operation condition is the normal operation condition of functional FETs used in a semiconductor chip. According to another embodiment of the invention, reliability sensor 100 may be operated at least most of the time under the same or substantially similar forward saturated operation condition as functional FETs, thereby mimicking as closely as possible any aging effect or degradation effect of functional FETs whose reliabilities are being monitored by reliability sensor 100.

During forward saturated operation condition, "hot carriers" may be created along channel region 106 of reliability sensor 100. Here, the term "hot carriers" generally refers to either holes or electrons that may have gained sufficiently high kinetic energy after being accelerated in areas within a semiconductor device by an electric field of high intensity. In the present embodiment of a CMOS-NFET device 100, which is used as a reliability sensor operated under forward saturated operation condition, the majority of hot carriers may be electrons ("hot electrons") in the channel region 106 between source region 102 and drain region 103. The forward saturated operation condition may create a strong electric field in the channel region 106, causing the creation of electron density 201 whose distribution decreases along channel region 106, from source region 102 to drain region 103, and eventually reaches a pinch-off point 203. The strong electric field in channel region 106 may cause at least some of the electrons to gain high kinetic energy during moving across channel region 106 to become hot carriers. As a result, some of the hot carriers 202 or hot electrons as in this case, with sufficiently high kinetic energy, may get injected into and/or trapped in areas of reliability sensor 100 where they are not intended to or destined for, as being described below in more details.

For example, reliability sensor 100 may include gate dielectric layer 105, which may be a gate insulating layer, formed directly on top of channel region 106 of substrate 101 as described above. Further for example, in the case that gate dielectric layer 105 is an oxide layer and substrate 101 is a silicon substrate, the interface between gate dielectric layer 105 and channel region 106 is a Si—$SiO_2$ interface. Hot carriers 202 may be trapped along the interface between gate dielectric layer 105 and silicon channel region 106 with most being trapped inside gate dielectric layer 105 close to drain region 103. The trapped hot carriers are sometimes referred to as in an "interface state", and may form a space charge (volume charge) that increases over time as more charges get trapped.

Over time, for example, during the regular usage of a semiconductor chip, these trapped hot carriers or space charges formed by these trapped hot carriers may cause shift in at least some of the characteristics of a FET, which in the present embodiment is reliability sensor 100. Such characteristics may include, for example, threshold voltage (Vth), on-switch current (Ion), and conveyed conductance (gm). For example, electrons in the "interface state" may act as coulomb scattering centers to cause decrease in local surface mobility of other electrons and increase in flat-band voltage, particular in areas close to drain region 103. The combined effect of an increase in flat-band voltage and decrease in local surface mobility, once the hot carrier induced damages have accumulated substantially over time, may be demonstrated or manifested in a significant drop in the overall drain current (Ion). The FET device degradation and/or instability caused by hot carrier injection are sometimes referred as "hot carrier effect". The shift in above characteristics is sometimes known as an aging effect of the FET device.

Figure 4:
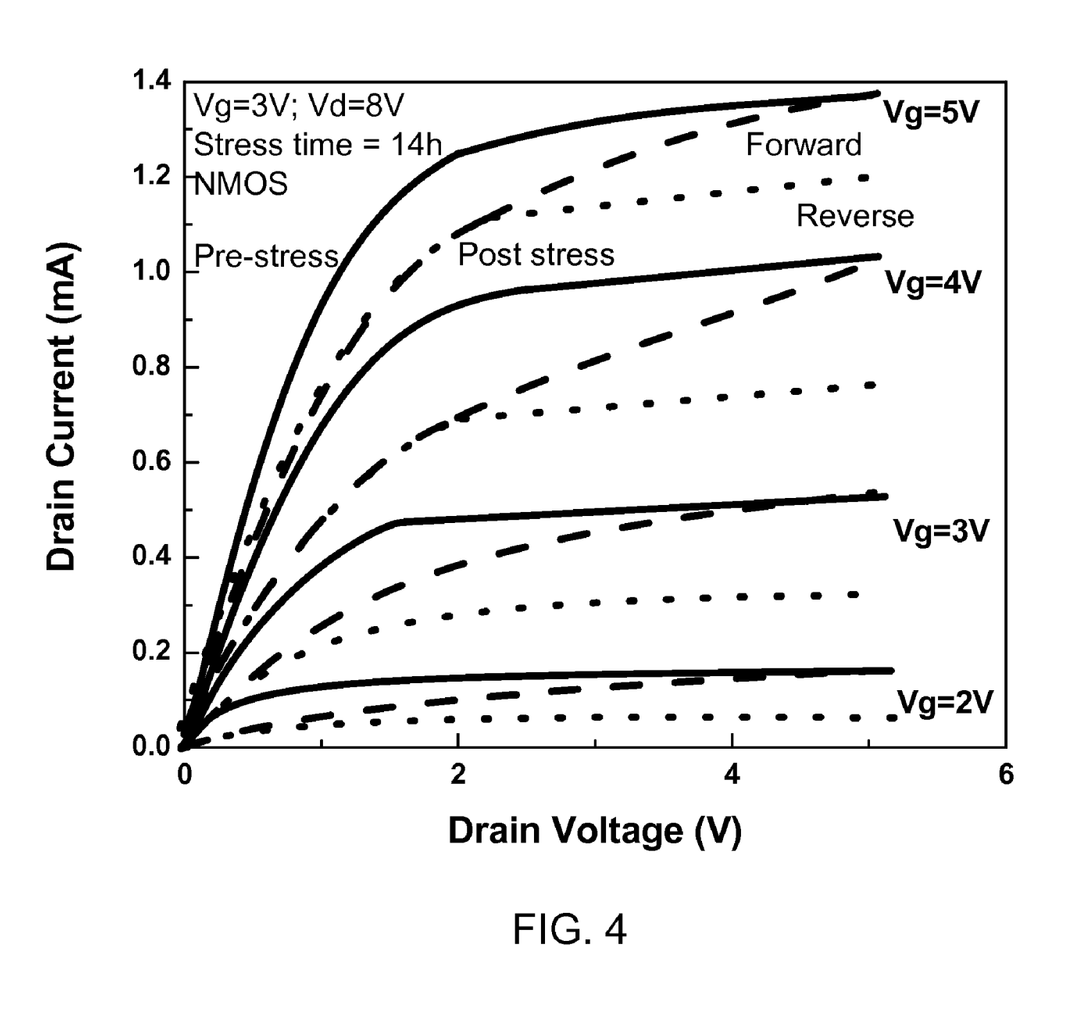
FIG. 4 is a chart of sample test results of a field-effect-transistor before and after stress made in accordance with another embodiment of the invention.

Reference is made briefly to FIG. 4, which is a chart of sample test results of a field-effect-transistor before and after being subjected to a stress condition in accordance with another embodiment of the invention. The FET under test was an n-type CMOS-FET (NFET) and measurement results of drain current versus drain voltage, at a pre-stress condition, were first recorded and are shown as solid lines in FIG. 4. The FET was then placed under, or subjected to, a stressed condition with the gate being applied a voltage of three volts (3V); the drain being applied a voltage of eight volts (8V); and the source being grounded for a time duration of fourteen hours (14 h). The above stress condition was carefully designed to simulate possible aging effect of a regular FET under normal forward saturated operation condition over a long period time and in most cases over years. After being conditioned under above stress, the FET was then tested again and measured for possible changes in drain current at different drain voltages, under different gate voltage conditions.

In FIG. 4, x-axis denotes voltages being applied to the drain and y-axis denotes corresponding drain currents being measured. The measurements were made at four different gate bias voltages $V_G$ of 2V, 3V, 4V and 6V, and were made for both forward and reverse operation conditions. In comparison with test results obtained in pre-stress condition, FIG. 4 clearly illustrates that drain current in the normally linear region (drain voltage less than ~2V) decreased significantly when the FET was biased under un-saturated conditions. The significant decrease may be attributed to an increase in flat-band voltage and decrease in surface mobility near the drain region of the FET.

When the FET was biased at saturation of drain voltage around for example four (4) to five (5) volts and in a forward operation condition, the amount of drain current being affected by the stress-conditioning of the FET appears to become less severe. This may be explained with reference to FIG. 2. During saturation when the gate bias voltage creates a depletion region from pinch-off point 203 to drain 103, in electron density 201 which normally extends across channel region 106 to reach drain 103, the drain current becomes mainly governed by the physical properties of the portion of inverted channel between source 102 and pinch-off point 203 (FIG. 2). In other words, changes in drain current become virtually independent of local oxide and interface characteristics between pinch-off point 203 and drain 103. Since the hot carrier induced oxide and interface damages are mostly concentrated in this depletion region between pinch-off point 203 and drain 103, their influence on the drain current becomes relatively less severe under saturation condition than under un-saturated condition.

Reference is made back to FIG. 2. Here, it is illustrated that electron density 201 near vicinity of drain 103 is significantly less than that around source 102, and may even have created a depleted region beyond pinch-off point 203. Therefore, the impact of trapped hot carriers 202 (or hot electrons) on the overall drain current is generally less obvious.

Figure 3:
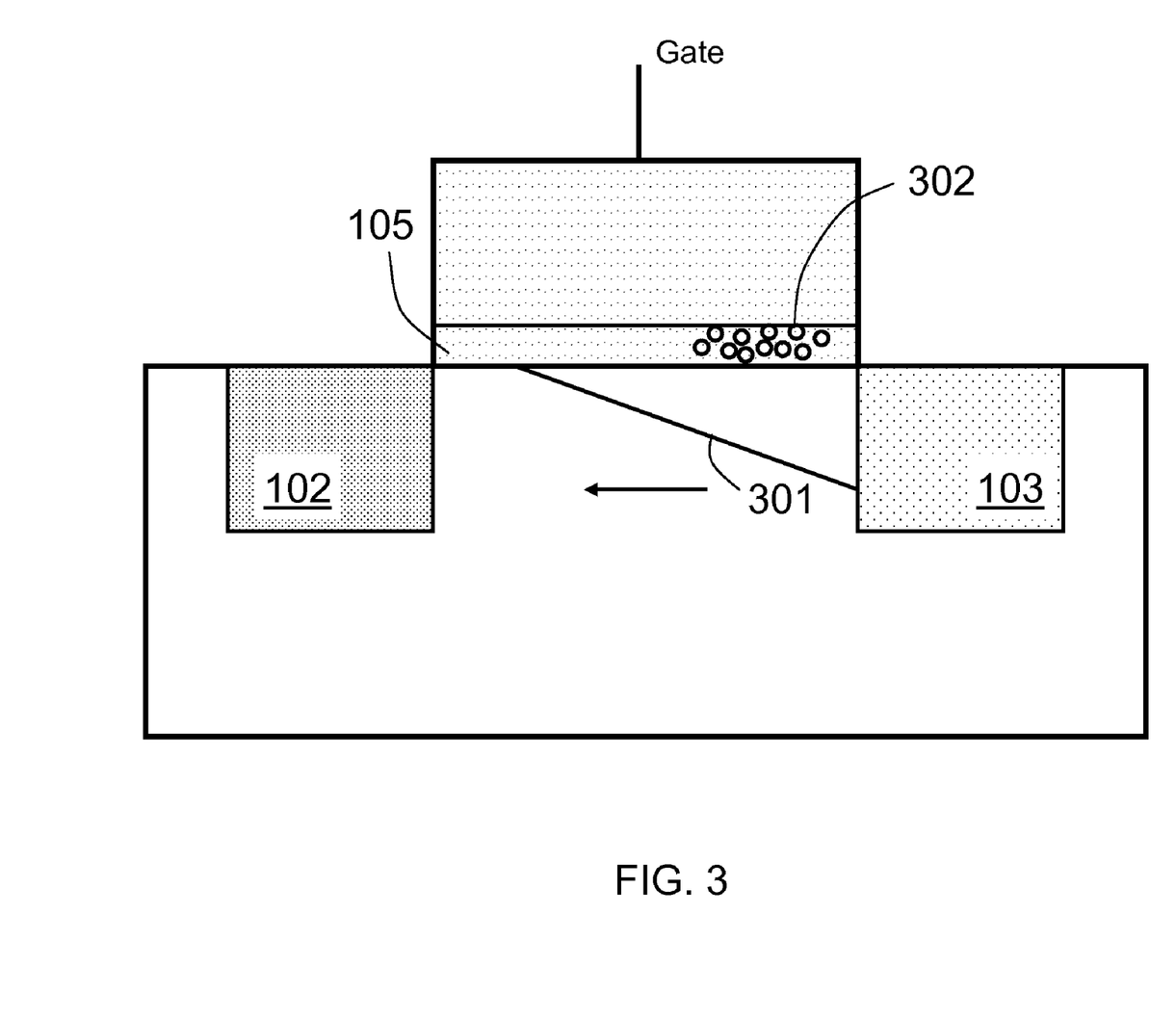
FIG. 3 is a demonstrative illustration of a reliability sensor being operated under a reverse saturation operation condition according to another embodiment of the invention.

FIG. 3 is a demonstrative illustration of a reliability sensor being operated under a reverse saturation operation condition according to another embodiment of the invention. For example, an embodiment of the invention may include a method of detecting influence of aging effect on drain current of reliability sensor 100 through operating reliability sensor 100 in a reverse direction, that is, a direction opposite to the regular operation direction. More specifically, in order to detect changes or drops in channel current (drain current) caused by trapped hot carriers over time due to aging effect, reliability sensor 100 may be reverse biased, and preferably reverse biased at saturation, by applying a voltage to source 102 and by grounding drain 103. As being illustrated in FIG. 3, under this reverse saturated operation condition, electrons flow from "source" 103 towards "drain" 102 forming an electron density 301. Here, quotation mark " " is used since "source" 103 is actually a drain and "drain" 102 is actually a source under regular forward saturated operation condition.

According to an embodiment of the invention, electron density 301 may substantially resemble a mirror image of electron density 201 as in forward saturated operation direction as shown in FIG. 2, and may decrease from "source" 103 to "drain" 102. By operating reliability sensor 100 in this reversed direction opposite to a regular operation direction, at around vicinity of "source" 103, a much larger electron density 301 may be obtained according to an embodiment of the invention. Thereby, impact on the drain current caused by the trapped hot carriers 302, which were hot carriers 202 accumulated during regular forward saturated operation condition as in FIG. 2, may be magnified by this large electron density at around vicinity of drain 103. Therefore, the impact may become more easily detectable. The significant difference in electron densities at around drain 103 shall be appreciated when reliability sensor 100 is operated under forward and reverse saturated operation conditions, as shown in FIG. 2 and FIG. 3, respectively.

Furthermore, it is to be understood that embodiment of the invention may not be limited in the above respect of saturated operation condition. An un-saturated reverse operation condition may be used as well for the detection of changes in drain current since even under un-saturated operation condition, electron density 301 around the drain region 103 in most situations will be larger than that under forward saturated operation condition, making the detection of "hot carrier" caused impact easier according to yet another embodiment of the invention. Nevertheless, a reverse saturated operation condition is generally preferable and a reverse saturated operation condition that mirrors the forward saturated operation condition, meaning having substantially same gate and drain bias voltages, may be more preferable when the ease of actual implementation of reliability sensor 100 is considered using analog circuits that will be able to provide both forward and reverse bias voltages and currents.

Reference is made briefly to FIG. 4 again. With comparison to forward operation condition at saturation, channel drain current of the FET under reverse saturated operation condition has a much bigger noticeable drop, particularly when drain voltage being applied ranges from about three (3) volts to about five (5) volts. The strong asymmetric characteristic between forward saturation current and reverse saturation current is primarily due to localization of oxide and interface damages, at close to or near the drain end of channel, caused by hot carriers during device forward bias operation. As a result, shift in drain current (Ion) in reverse saturated operation condition may be magnified.

Figure 5:
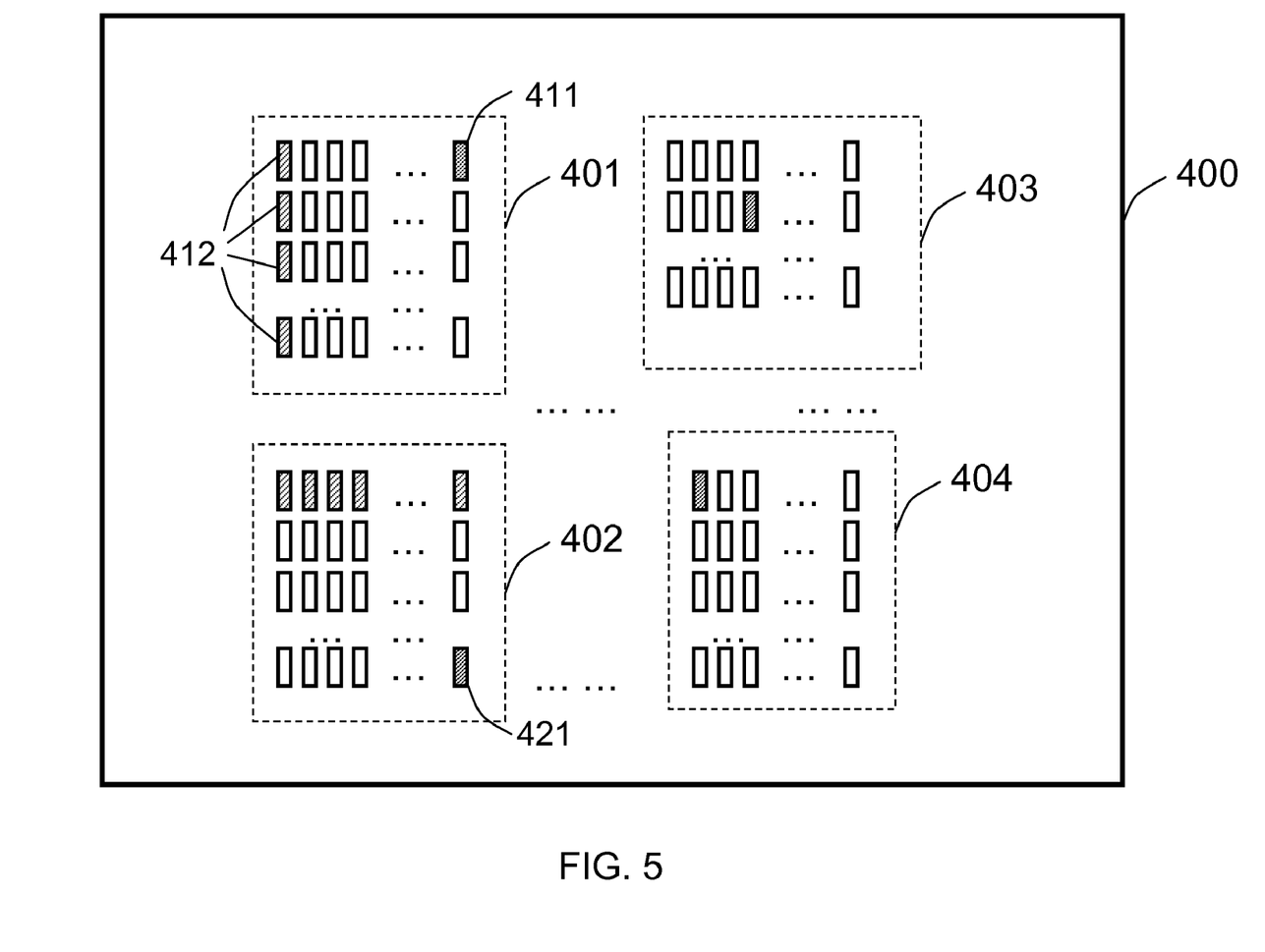
FIG. 5 is a demonstrative illustration of a semiconductor chip employing one or more reliability sensors and replacement transistors according to an embodiment of the invention.

FIG. 5 is a demonstrative illustration of a semiconductor chip employing a plurality of FET reliability sensors and replacement FETs according to an embodiment of the invention. For example, semiconductor chip 400 may include a plurality of FET groups 401, 402, 403, and 404. One or more of the FET groups may include at least one reliability sensor such as reliability sensor 411 for FET group 401 and reliability sensor 421 for FET group 402. According to an embodiment of the invention, a reliability sensor, for example reliability sensor 411, may detect a change in reverse saturated operation current, compared with an initial forward saturated operation current recorded when semiconductor chip 400 is put into regular usage. After a period of operational time under regular forward saturated operation condition, and more particularly when the change becomes larger than a certain percentage of for example 5% to 10% of the initial forward saturated operation current, reliability sensor 411 may provide a reliability warning signal through, for example, its supporting analog circuit as being described below in more details with reference to FIG. 6. The warning signal may be scaled or graded based upon the severity of changes in operation current, and in some instances may indicate that the group of FETS 401 is approaching to an unacceptable level of reliability failure.

According to yet another embodiment of the invention, when reliability sensor 411 detects a change in forward saturated operation current, compared with the initial value of the same forward operation current when semiconductor chip 400 is put into regular usage, and more particularly when the change becomes larger than a certain percentage, for example, 5% to 10% of the initial value, then reliability sensor 411 may prompt for an external instruction as to whether to replace some of the FETs in the FET group 401, which may be a set of pre-selected FETs that are deemed critical to the overall performance of semiconductor chip 400, with a set of built-in backup FETs 412. In yet another embodiment of the invention, reliability sensor 411 may automatically, with or without first providing a critical reliability warning signal or obtaining an external instruction, replace and/or repair the set of pre-selected FETs with the set of built-in backup FETs 412.

Figure 6:
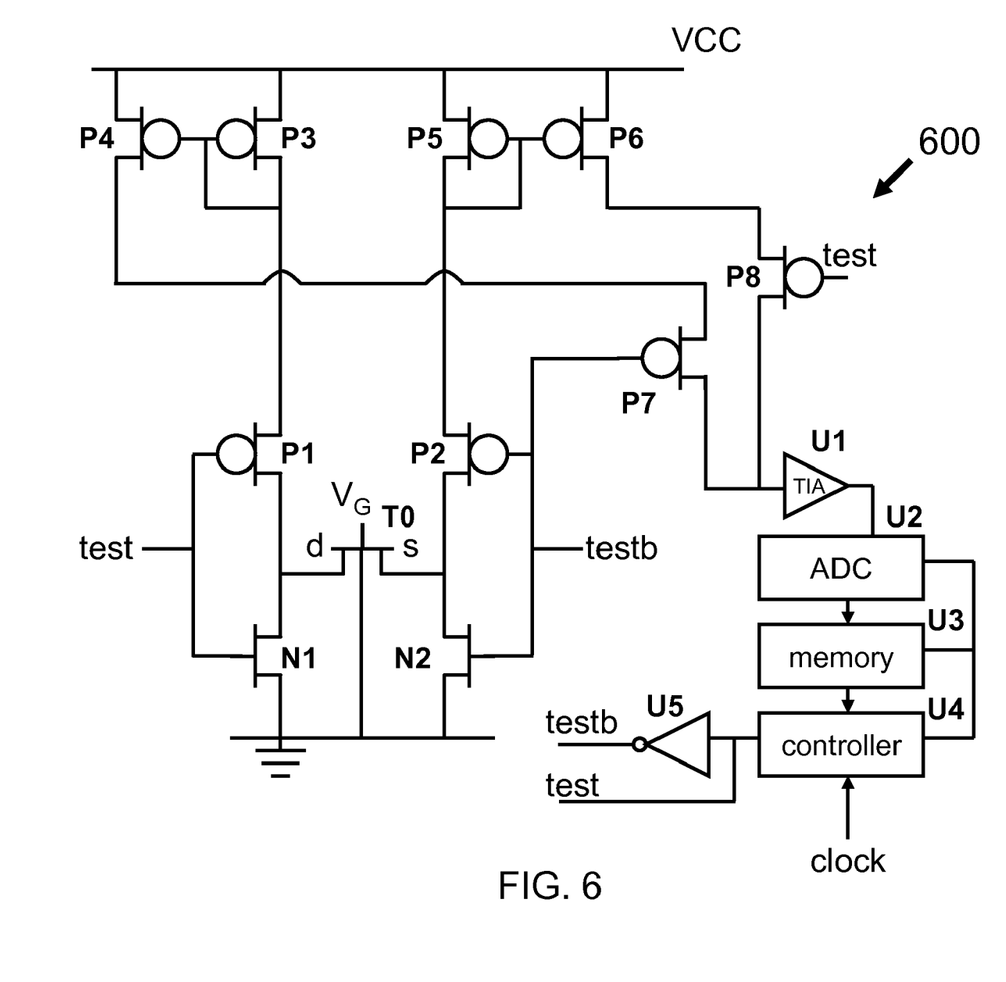
FIG. 6 is a demonstrative illustration of an analog circuit supporting operation of a reliability sensor according to another embodiment of the invention.

FIG. 6 is a demonstrative illustration of an analog circuit supporting operation of a reliability sensor according to another embodiment of the invention. For example, analog circuit 600 may provide bidirectional, both forward and reverse, operation support for reliability sensor T0. T0 may be an n-type CMOS-FET (NFET) which may be reliability sensor 100 as being discussed previously with reference to FIG. 3. In FIG. 6, voltage bridge of P1, P2, N1 and N2 may be designed to provide reliability sensor T0 forward bias voltage, when "test" is at logic low with "testb" being at logic high, and reverse bias voltage when "test" is at logic high with "testb" being at logic low. In yet another embodiment of the invention, reliability sensor T0 may be reliability sensor 411 (FIG. 5) and may operate at forward saturated operation condition at least most of the time as other functional FETs inside FET group 401 (FIG. 5) do, whose reliabilities are being monitored by reliability sensor T0. In addition, two pairs of current mirrors: P3-P4, P5-P6 may be used to couple drain current to reliability sensor T0 under both the forward and the reverse operation conditions. The amount of gate voltage $V_G$ may be selected such that reliability sensor T0 is always operated at saturation mode under both forward and reverse operation conditions.

Analog circuit 600 may include other components as being illustrated in FIG. 6 for reliability sensor T0 to operate properly. For example, analog circuit 600 may include a trans-impedance amplifier (TIA) U1, which converts an input current to an output voltage. Furthermore, U1 may be able to measure the current from either current mirror P3-P4, or current mirror P5-P6, by the switching of FET P7 and P8. In FIG. 6, U2 is an analog to digital converter (ADC) which may convert the analog output voltage from trans-impedance amplifier U1 to a digital data and save the digital data in a digital memory U3. U4 is a controller with an external (or internal) clock, which may generate logical signal "test" and/or "testb" for the controlling of reliability sensor T0, and may be able to process the digital data saved in the memory and determine a proper test period.

Figure 7:
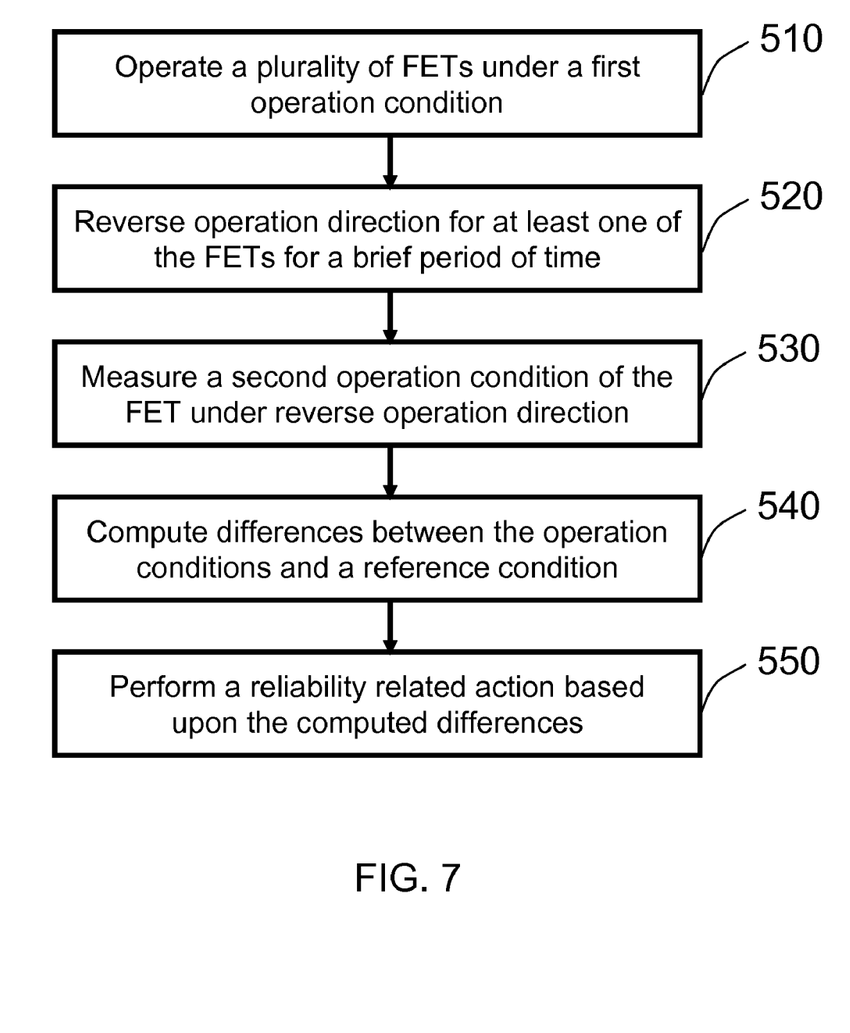
FIG. 7 is a simplified flowchart illustration of a method of operating a reliability sensor according to yet another embodiment of the invention.

FIG. 7 is a simplified flowchart illustration of a method of operating a reliability sensor according to yet another embodiment of the invention. For example, the method may include operating a plurality of field-effect-transistors in a first operation condition (510). The plurality of FETs may be manufactured in a single integrated circuit, and one of the plurality of FETs may be a reliability sensor. The first operation condition may be a forward saturated operation condition and have a first operation current and a first operation voltage. The method may further include reversing an operation direction for at least one of the FETs, for example, the reliability sensor, for a brief period of time (520). The brief period of time may be substantially shorter than a regular period of time when the plurality of FETs is operated under the first operation condition. For example, the brief period of time may be short enough so as not to create or cause any detectable difference in reliability between the reliability sensor and the rest of the FETs. In one instance, the brief period of time may be less than 0.1% of the regular period time and more preferable less than 0.01% of the regular period of time.

In one embodiment of the invention, initial values of the first operation condition, which may be a forward saturated operation condition, may be recorded at a time when the plurality of FETs is put into regular usage for the first time. The initial values of the forward saturated operation condition, including an operation current and an operation voltage, may be used as a reference current and a reference voltage, respectively, for determining reliability over time of the plurality of FETs under monitoring as being described below in more details.

The method may further include measuring a second operation condition of the reliability sensor (530). The second operation condition may be measured when the reliability sensor is either under forward saturated operation condition or reverse saturated operation condition. The second operation condition includes for example a second operation current and a second operation voltage. In one instance, the second operation voltage under either forward or reverse operation conditions may be substantially the same as the reference voltage under the forward saturated operation condition.

The method may further include computing a difference between the first and the second operation condition, and more specifically between the first and the second operation currents (540), and the computed difference may prompt a reliability related action being taken depending upon the type of difference (550). For example, a change in forward saturated operation current exceeding a pre-determined percentage of the initial operation current, for example 5% or 10% (or any other percentage that may be deemed proper), may be used as an indicator that a certain pre-selected set of FETs may need to be repaired. The repair may include replacing the pre-selected set of FETs with a set of built-in backup FETs, either automatically or acting upon receiving an external instruction. Further for example, a change in reverse saturated operation current, measured during the brief period of time of reverse saturated operation, that exceeds a pre-determined percentage of, for example 5% or 10% (or any other percentage that may be deemed proper as a pre-determined threshold), of the initial operation current may be used in determining the generation of a scaled reliability warning signal.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
providing a plurality of field-effect-transistors (FETs) in a single integrated circuit (IC);
operating said plurality of FETs under a first operation condition;
reversing an operation direction for at least one of said plurality of FETs for a brief period of time;
measuring a second operation condition of said one of said plurality of FETs during said brief period of time; and
providing a reliability indicator of said plurality of FETs based upon a difference computed between said second operation condition and a reference operation condition, wherein said first operation condition is a forward saturated operation condition having a first operation current and a first operation voltage; said second operation condition is a reverse saturated operation condition having a second operation current and a second operation voltage; and said reference operation condition, having a reference operation current and a reference operation voltage, is said forward saturated operation condition at a time when said plurality of FETs starts regular usage.

2. The method of claim 1, wherein said computing a difference comprises calculating a difference between said second operation current and said reference operation current, with said second operation voltage being substantially same as said reference operation voltage.

3. The method of claim 2, wherein said providing a reliability indicator comprises comparing said difference between said second and said reference operation currents with a predetermined threshold, and providing a warning signal being scaled based upon how far said difference is away from said predetermined threshold.

4. The method of claim 3, further comprising:
recording said reference operation current of said one of said plurality of FETs at said time when said plurality of FETs starts regular usage; and
setting said predetermined threshold as a percentage of said reference operation current.

5. The method of claim 4, wherein said predetermined threshold is set at approximately 10% of said reference operation current.

6. The method of claim 1, wherein said one of said plurality of FETs is a reliability sensor, further comprising:
recording said reference operation current of said reliability sensor at said time when said plurality of FETs, including said reliability sensor, starts regular usage;
computing a forward-forward difference between said first operation current of said reliability sensor and said reference operation current, while said first operation voltage being substantially same as said reference operation voltage; and
providing a recommendation to replace a pre-selected set of FETs of said plurality of FETs if said forward-forward difference exceeds a pre-set value.

7. The method of claim 6, wherein said pre-set value is approximately 10% of said reference operation current.

8. The method of claim 6, further comprising:
replacing said pre-selected set of FETs with a set of built-in backup FETs automatically or upon receiving an external instruction following said recommendation.

9. The method of claim 1, wherein said one of said plurality of FETs is a reliability sensor and said brief period of time, when said reliability sensor is operated under said second operation condition, is substantially shorter than a regular period of time when said plurality of FETs are operated under said first operation condition, thereby said brief period of time will not create any detectable difference in reliability between said reliability sensor and rest of said plurality of FETs not including said reliability sensor.

10. The method of claim 9, wherein said brief period of time is less than 0.1% of said regular period of time.

11. The method of claim 1, wherein said providing a plurality of FETs comprises providing said plurality of FETs which has substantially same dimensions and substantially similar structures, thereby experiences a substantially same reliability degradation process over time.

12. The method of claim 1, wherein said providing a plurality of FETs comprises providing said plurality of FETs which are manufactured in close vicinity to each other of said single IC to experience a substantially same environmental effect.

13. A method comprising:
 providing a plurality of field-effect-transistors (FETs) in a single integrated circuit (IC) including a reliability sensor;
 operating said plurality of field-effect-transistors (FETs) under a first operation condition including a first operation current and a first operation voltage;
 reversing an operation direction for at least one of said plurality of FETs for a brief period of time;
 measuring a second operation condition including a second operation current and a second operation voltage of said one of said plurality of FETs during said brief period of time; and
 providing a reliability indicator based upon a difference computed between said second operation current and a reference operation current,
 wherein said one of said plurality of FETs is a reliability sensor and said brief period of time, when said reliability sensor is operated under said second operation condition, is substantially shorter than a regular period of time when said plurality of FETs are operated under said first operation condition, thereby said brief period of time will not create any detectable difference in reliability between said reliability sensor and rest of said plurality of FETs.

14. The method of claim 13, wherein said reference operation current is said first operation current recorded at a time when said plurality of FETs starts regular usage.

15. The method of claim 14, wherein computing said difference is performed when said second operation voltage is kept substantially same as a reference operation voltage being recorded at said time when said plurality of FETs starts regular usage.

16. The method of claim 15, wherein said providing a reliability indicator comprises comparing said difference between said second and said reference operation currents with a predetermined threshold, and providing a warning signal being scaled based upon how far said difference is away from said predetermined threshold.

17. The method of claim 16, where said predetermined threshold is a percentage of said reference operation current.

18. The method of claim 13, wherein said brief period of time is less than 0.01% of said regular period of time.

19. An integrated circuit, comprising:
 a plurality of field-effect-transistors (FETs);
 an analog circuit being adapted to supply both a forward operation current and a reverse operation current to at least one of said plurality of FETs; and
 a control circuit being adapted to compute a difference between said reverse operation current and a reference operation current and being adapted to respond with a reliability related action based upon said computed difference.

20. The integrated circuit of claim 19, wherein said reference operation current is said forward operation current recorded at a time when said plurality of FETs starts regular usage.

21. The integrated circuit of claim 19, wherein said plurality of FETs has substantially same dimensions and substantially similar structures, thereby experiences a substantially same reliability degradation process during regular usage.

22. The integrated circuit of claim 21, wherein based upon said computed difference, said control circuit either provides a warning signal scaled based upon how far said computed difference is away from a predetermined threshold, or performs a self-repair function by replacing a pre-selected set of FETs of said plurality of FETs with a set of built-in backup FETs.

\* \* \* \* \*